US006989512B2

(12) United States Patent
Lin et al.

(10) Patent No.: US 6,989,512 B2
(45) Date of Patent: Jan. 24, 2006

(54) HEAT GENERATOR

(75) Inventors: Jhy-Chain Lin, Tu-Cheng (TW); Ga-Lane Chen, Fremont, CA (US)

(73) Assignee: Hon Hai Precision Industry Co., Ltd., (TW)

( * ) Notice: Subject to any disclaimer, the term of this patent is extended or adjusted under 35 U.S.C. 154(b) by 0 days.

(21) Appl. No.: 10/951,422

(22) Filed: Sep. 28, 2004

(65) Prior Publication Data

US 2005/0133491 A1    Jun. 23, 2005

(30) Foreign Application Priority Data

Dec. 19, 2003    (CN) ...................... 200320119784 U

(51) Int. Cl.
*H05B 1/02*    (2006.01)
*H05B 3/28*    (2006.01)
*G01N 25/18*    (2006.01)
*F25B 21/02*    (2006.01)

(52) U.S. Cl. ...................... 219/385; 219/201; 219/494; 374/44

(58) Field of Classification Search ...................... None
See application file for complete search history.

(56) References Cited

U.S. PATENT DOCUMENTS 3,114,255 A * 12/1963 Niven .......................... 374/44

| 4,929,089 A | 5/1990 | Tsuchida ...................... 374/44 |
| 5,258,929 A * | 11/1993 | Tsuchida ...................... 702/136 |
| 6,550,961 B1 | 4/2003 | Ueda ........................... 374/44 |
| 2003/0072349 A1 | 4/2003 | Osone et al. ................. 374/43 |

FOREIGN PATENT DOCUMENTS

DE    2724846 A  * 12/1978

* cited by examiner

*Primary Examiner*—Joseph Pelham
(74) *Attorney, Agent, or Firm*—Morris Manning & Martin; Tim Tingkang Xia, Esq.

(57) ABSTRACT

A heat generator includes a cubic heat generating member for outputting heat flow. The heat generating member includes a heat flow output face and five heat flow insulation faces. Five thermoelectric coolers are attached on the five heat flow insulation faces respectively. A heat flow compensating circuit is electrically connected between each heat flaw insulation face and a corresponding thermoelectric cooler. The circuit is capable of controlling heat generated by the thermoelectric cooler to cause the temperature of the heating face of the thermoelectric cooler to be equal to the temperature of the heat flow insulation face. Controlling the heating in this manner results in the output of heat energy from the heat flow output face of the heat generating member being substantially equal to the heat energy generated by the heat generating member.

13 Claims, 1 Drawing Sheet

HEAT GENERATOR

CROSS-REFERENCE TO RELATED APPLICATIONS

This application is related to U.S. application Ser. No. 10/930,551, filed Aug. 31, 2004, and U.S. application Ser. No. 10/951,360, filed Sep. 28, 2004. The disclosures of the above identified applications are incorporated herein by reference.

TECHNICAL FIELD

The present invention relates to a heat generator, and particularly to a heat generator having heat flow compensation capability.

BACKGROUND

When developing new material, especially heat conductive material, the heat conductivity of the material needs to be measured. When designing a heat dissipation device for electronic devices, the designer needs to know the heat conductive capability of the material of the heat dissipation device. Precisely measuring heat conductivity of the material is the key of the design.

In early times, the heat conductivity of a material is measured via sandwiching a specimen made of the material between a heat source and an object with a lower temperature. The heat generated by the heat source flows through the specimen to the object with lower temperature. A temperature gradient $\Delta T$ exists between two opposite ends of the specimen. The distance between the two opposite ends of the specimen $\Delta X$ can be measured. Assuming that all of the heat generated by the heat source flow through the specimen, the heat energy Q of the heat flow flowing through the specimen is equal to the heat energy Q' generated by the heat source. The heat energy Q' generated by the heat source is calculated according to the equation as follows:

$$Q'=\alpha I^2 R$$

R is the resistance value of a thermal resistor embedded in the heat source, I represents the electric current flowing through the thermal resistor, and $\alpha$ is a ratio of electrical power converted to heat energy of the thermal resistor. The heat conductivity K of the material of the specimen can be calculated according to the equation as follows:

$$K=q*\Delta X/\Delta T$$

q represents heat flow which is the rate at which heat energy Q flows through the specimen per square meter, in $W/m^2$.

In the above method, the specimen firmly contact with one face of the heat source. The other faces of the heat source are heat insulated by a layer of insulation material covered thereon in order to ensure all of the heat generated by the heat source flow through the specimen. However, the insulation capability of the insulation material, such as alumina, is limited. Some of the heat generated by the heat source is inevitably dissipated through the other faces which do not contact the specimen. That means, the heat energy Q flowing through the specimen is not equal to the heat energy Q' generated by the heat source. Thus, the value of the heat flow q flowing through the specimen exists an inaccuracy which results in the calculated value of the heat conductivity K of the material of the specimen existing an inaccuracy.

SUMMARY OF THE INVENTION

Accordingly, an object of the present invention is to provide a heat generator which can output a predetermined heat flow precisely.

To achieve the above-mentioned object, a heat generator in accordance with the present invention includes a heat generating member having a heat flow output face, a temperature compensating member attachable surrounding the heat generating member except for the heat flow output face thereof, and a heat flow compensating circuit electrically connected between the heat generating member and the temperature compensating member. The circuit is capable of controlling heat generated by the temperature compensating member to cause no heat flow between the temperature compensating member and the heat generating member. Accordingly, the heat energy of the heat flow outputting from the heat flow output face of the heat generating member is equal to the heat energy generated by the heat generating member.

Other objects, advantages and novel features of the present invention will be drawn from the following detailed description of a preferred embodiment of the present invention with attached drawings, in which:

DESCRIPTION OF A PREFERRED EMBODIMENT

Figure 1:
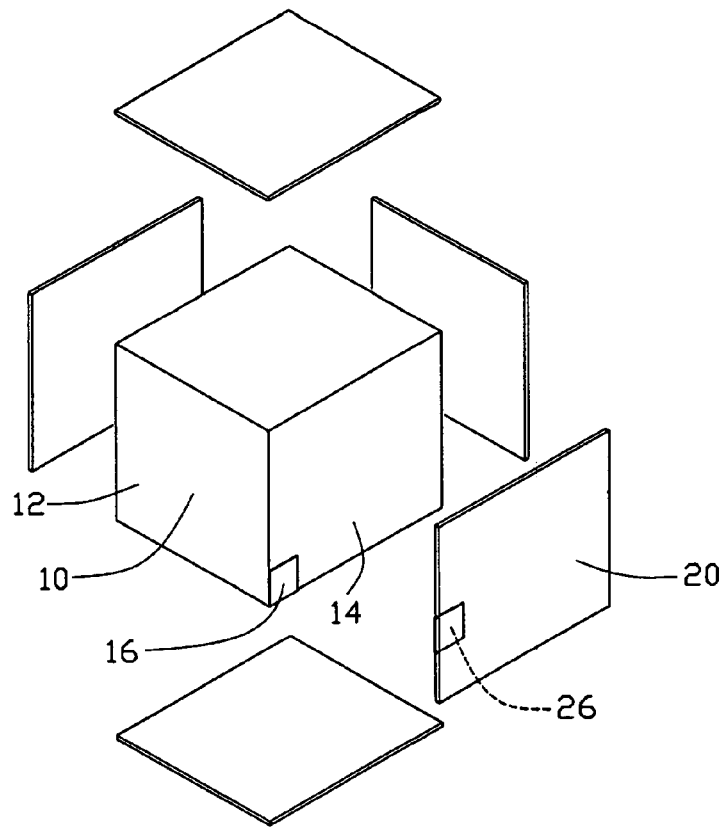
FIG. 1 is an exploded view of a heat generator in accordance with an embodiment of the present invention.

Referring to FIG. 1, a heat generator in accordance with the preferred embodiment of the present invention comprises a heat generating member 10 and a temperature compensating member.

The heat generating member 10 is a polyhedron. In the preferred embodiment, we take a cube shape employed as an example of the heat generating member 10. The heat generating member 10 comprises six faces. One face 12 is used as a heat flow output face to provide heat to an object like a specimen and the other five faces 14 are used as heat insulation faces that no heat flow flows therethrough. A thermal resistor (not visible) is embedded in the heat generating member 10 for generating a predetermined amount of heat energy. The quantity Q' of the heat energy generated by the thermal resistor is calculated according to the following equation $$Q'=\alpha I^2 R.$$

wherein R is the resistance value of the thermal resistor, I represents the electric current flowing through the thermal resistor, and $\alpha$ is a ratio of electrical power converted to heat energy. A thermistor 16 is installed on each heat insulation face 14 of the heat generating member 10 and is configured for sensing the temperature of the heat flow insulation face 14.

The temperature compensating member comprises five plate-shaped thermoelectric coolers 20 which are attached on the five heat insulation faces 14 of the heat generating member 10 respectively. The thermoelectric cooler 20 works based on peltier effect which means a change in temperature at the junction of two different metals produced when an electric current flows through them. When the thermoelectric cooler 20 is electrified, it forms one heating face with a uniform temperature and one cooling face opposing the heating face. The heating face of the thermoelectric cooler 20 contacts with the heat insulation face 14 of the heat generating member 10 for compensating the heat generating member 10 for the loss of heat flow transferred from the heat insulation face 14. The temperature of the heating face of thermoelectric cooler 20 is adjustable when the electric current flowing through the thermoelectric cooler 20 is adjusted. A thermistor 26 is installed on the heating face of each thermoelectric cooler 20 for sensing the temperature of the heating face.

Figure 2:
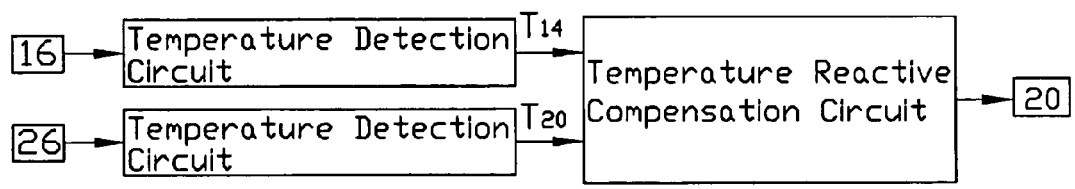
FIG. 2 is a diagram showing the heat flow compensating circuit of the heat generator.

FIG. 2 shows a heat flow compensating circuit electrically connected between the thermistors 16, 26 and the thermoelectric cooler 20. The heat flow compensating circuit comprises two temperature detection circuits electrically connected to the thermistors 16, 26 respectively, and a temperature reactive compensating circuit electrically connected to the thermoelectric cooler 20. The two temperature detection circuits are used to sense the temperature of the heat flow insulation face 14 and the heating face of the thermoelectric cooler 20 and output a pair of corresponding temperature signals T14, T20 to the temperature reactive compensating circuit. When the temperature of the heating face of the thermoelectric cooler 20 is not equal to that of the beat flow insulation face 14, the temperature reactive compensating circuit outputs an adjusted current to the thermoelectric cooler 20 to adjust the temperature of the heating face of the thermoelectric cooler 20 to thereby cause the temperature of the heating face of the thermoelectric cooler 20 to be equal to the temperature of the heat flow insulation face 14 of the heat generating member 10. Thus, no heat flow flows between the heat flow insulation face 14 of the heat generating member 10 and the thermoelectric cooler 20 and all of the heat generated by the heat generating member 10 is transferred from the heat flow output face 12 of the heat generating member 10 to a specimen (not shown). Therefore, the heat energy Q flowing Through the specimen is equal to the heat energy Q' generated byte heat generating member 10 and a predetermined heat flow can be precisely transferred from the heat generator.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat generator comprising:
   a heat generating member for generating heat, comprising a heat flow output face and a plurality of heat flow insulation faces;
   a plurality of thermoelectric coolers each having a temperature compensating face contacting a corresponding heat flow insulation face; and
   a heat flow compensating circuit electrically connected between each of the thermoelectric coolers and the corresponding heat flow insulation face for maintaining a state of no heat flow flowing between the temperature compensating face of said thermoelectric cooler and the corresponding heat flow insulation face, whereby the heat energy of the heat flow outputting from the heat flow output face is equal to the heat energy of the heat generated by the heat generating member.

2. The heat generator as claimed in claim 1, wherein a first thermistor is provided at each of the heat flow insulation faces and a second thermistor is provided at the temperature compensating face of each of thermoelectric coolers.

3. The heat generator as claimed in claim 2, wherein the heat flow compensating circuit comprises two temperature detection circuits connected to the first and second thermistors respectively for sensing the temperature of said heat flow insulation face and the temperature compensating face of said thermoelectric cooler, and a temperature reactive compensating circuit connected to said thermoelectric cooler for outputting an adjusted current to said thermoelectric cooler, when the temperature of said heat flow insulation face and the temperature compensating face of said thermoelectric cooler are not equal to each other, to adjust the temperature of the temperature compensating face of said thermoelectric cooler to thereby cause the temperature of the temperature compensating face of said thermoelectric cooler to be equal to the temperature of said heat flow insulation face.

4. The heat generator as claimed in claim 3, wherein the heat generating member is a polyhedron.

5. The heat generator as claimed in claim 4, wherein the heat generating member is a cube with five heat insulation faces.

6. The heat generator as claimed in claim 3, wherein the thermoelectric cooler when electrified forms one heating face with a uniform temperature acted as the temperature compensating face and one cooling face opposite to the heating face.

7. A heat generator comprising:
   a heat generating member comprising a heat flow output face;
   a temperature compensating member attachably surrounding the heat generating member except the heat flow output face and comprising at least one thermoelectric cooler each forming a heating face contactable with the heat generating member and a cooling face when electrified; and
   a heat flow compensating circuit electrically connected between the heat generating member and said at least one thermoelectric cooler, the circuit being capable of controlling heat generated by said at least one thermoelectric cooler to cause no heat flow flowing between the heating face of said at least one thermoelectric cooler and the heat generating member.

8. The heat generator as claimed in claim 7, wherein the heat flow compensating circuit comprises two temperature detection circuits electrically connected to thermistors on the heat generating member and said at least one thermoelectric cooler respectively for sensing the temperature thereof, and a temperature reactive compensating circuit electrically connected to said thermoelectric cooler for outputting an adjusted current to said at least one thermoelectric cooler, when the temperature of the heat generating member and the heating face of the temperature compensating member are not equal to each other, to adjust the temperature of the heating face of said thermoelectric cooler to thereby cause the temperature of the heating face of said at least one thermoelectric cooler to be equal to the temperature of the heat generating member.

9. The heat generator as claimed in claim 8, wherein the heat generating member is a polyhedron.

10. The heat generator as claimed in claim 9, wherein the heat generating member is a cube with five heat insulation faces, and the temperature compensating member comprises five thermoelectric coolers covering the five heat insulation faces respectively.

11. A method to provide constant heat to an object comprising steps of:
- providing a heat generating member to generate heat so as to transfer said heat to an object from a heat flow output face of said heat generating member;
- installing a temperature compensating member operating in accordance with peltier effect to surround faces of said heat generating member other than said heat flow output face; and
- operating said temperature compensating member to balance temperatures of said other faces of said heat generating member and said temperature compensating member.

12. The method as claimed in claim 11, wherein said temperature compensating member is a thermoelectric cooler defining a heating face to contact with at least one of said other faces of said heat generating member and a cooling face fronting away from said heat generating member in a condition of electrification of said thermoelectric cooler.

13. The method as claimed in claim 11, further comprising the step of using a circuit to sense said temperatures so as to conditionally start said operating step.

* * * * *